United States Patent [19]

Giraud

[11] 4,163,210

[45] Jul. 31, 1979

[54] ARRANGEMENT FOR CHECKING A CONTACT INSERTED BETWEEN A TRANSMITTER CIRCUIT AND A RECEIVER CIRCUIT TO ALLOW ELECTRICAL SIGNALS TO BE TRANSMITTED

[75] Inventor: Georges M. Giraud, Le Vesinet, France

[73] Assignee: Compagnie Internationale pour l'Informatique Cii-Honeywell Bull (Societe Anonyme), Paris, France

[21] Appl. No.: 875,564

[22] Filed: Feb. 6, 1978

[30] Foreign Application Priority Data

Feb. 7, 1977 [FR] France .................................. 77 03317

[51] Int. Cl.² ...................... G06F 11/00; G08B 29/00; H04L 25/02
[52] U.S. Cl. ............................ 340/146.1 E; 178/69 G; 235/302
[58] Field of Search ................ 178/69 G, 69 R, 2 R, 178/3; 340/146.1 E, 512, 513, 652; 179/175.3 F, 15 BF; 235/153 A

[56] References Cited

U.S. PATENT DOCUMENTS

| 3,500,318 | 3/1970 | Arlen | 340/146.1 E |
| 3,633,016 | 1/1972 | Walker et al. | 340/146.1 E |
| 3,706,987 | 12/1972 | Westphal | 340/513 |
| 3,943,348 | 3/1976 | Akriche et al. | 340/146.1 E |

Primary Examiner—Thomas A. Robinson
Attorney, Agent, or Firm—Cameron, Kerkam, Sutton, Stowell & Stowell

[57] ABSTRACT

An arrangement for checking contact betweena transmitter circuit situated upstream and a receiver circuit situated downstream, the contact being made to enable electrical signals corresponding to 1 and 0 logic states produced by the transmitter circuit to be transmitted in series to an input of the receiver circuit, is characterized in that it is formed by a first circuit situated upstream of the contact at the output of the transmitter circuit and a second circuit which is situated downstream of the contact at the input to the receiver circuit, the first circuit being designed to produce, at a first output connected to the second circuit, and if the contact is satisfactory, a current in a predetermined direction or the opposite direction in the presence of a signal representing a 1 or 0 logic state emitted by the transmitter circuit, the second circuit being designed to generate, at an output connected to the input of the receiver circuit, a signal corresponding to the logic state generated by the transmitter circuit when a current in the corresponding direction is emitted by the first circuit, the first circuit emitting a signal at a second output when the said current is present, this signal thus indicating that the contact is satisfactory.

5 Claims, 3 Drawing Figures

FIG: 2

ARRANGEMENT FOR CHECKING A CONTACT INSERTED BETWEEN A TRANSMITTER CIRCUIT AND A RECEIVER CIRCUIT TO ALLOW ELECTRICAL SIGNALS TO BE TRANSMITTED

BACKGROUND OF THE INVENTION

1. Field of the Invention

The present invention relates to a circuit arrangement for checking the quality of electrical contact between a transmitter circuit and a receiver circuit.

2. Description of the Prior Art

The transmission of electrical signals between a transmitter circuit and a receiver circuit generally takes place along conductors. The conductors are normally provided at their ends with terminals or connectors which enable contact to be made or not to be made between the transmitter and the receiver via the conductor which connects them. In many cases, the transmitter and receiver are fixed components which are in contact either permanently or for comparatively long periods of time. It is therefore generally satisfactory to ensure that there is good contact between the two components at the start of a signal-transfer operation to be carried out. When contact between the two ends of the conductor is made by plugging in pins of relatively large dimensions, the interference caused by dust or other contamination of an insulating nature is not troublesome and in this case there is no need to check the standard of contact.

Quite the opposite is true if a pin of small dimensions is badly inserted, because of the presence of dirt for example at the bottom of the socket into which the pin is inserted, and makes poor contact, which will be detrimental to the operations which would normally be performed with the signals received by the receiver. A check on contact becomes all the more necessary if the receiver involved is a portable one which is often moved and is set up in places where there is little protection from dirt. The problem of the quality of contact is even more critical when the transmitted signals are in the form of brief pulses emitted at relatively high frequency. In this case, dirt at the point where the pin makes contact may give rise under the conditions of pulsed transmission envisaged above, to a not inconsiderable stray capacity effect, and because of this, certain of the pulses emitted by the transmitter may be lost at the input to the receiver.

This possibility must be kept in mind particularly in cases where the transmitter and receiver circuits are logic circuits made up of discrete or integrated components. Links between such circuits are intended for an exchange of digital data in which pulses are transmitted from one circuit to the other at a given rate. In cases where the data exchanged has to be processed in synchronization in both circuits, a conductor is set aside to transmit so-called "clock" pulses to ensure this synchronization. In this example of an application of a contact inserted between two logic circuits to transmit either clock pulses or pulses representing digital data, it is important to measure the quality of contact during the whole time pulses are being transmitted, thus providing an assurance of the validity of the data exchanged and of the synchronous operation of the circuits.

A widely used method consists in checking the quality of contact between a transmitter circuit and a receiver circuit by measuring the voltage at the input to the receiver. If the contact is good, the voltage received at the input of the receiver is a predetermined function of the voltage measured at the output from the transmitter.

Another method envisions the use of a portable card for systems for processing electrical signals. In this case, the electrical contacts between a portable card and a data-processing system are made by pins which are inserted into cut-outs formed in the card until they reach terminal areas of conductors which are directly linked to a signal-processing receiver device. A predetermined voltage is applied between two electrodes which are inserted in two contact cut-outs which face a terminal area of one and the same conductor which is connected to the receiver and/or transmitter device. Contact is satisfactory if a predetermined current is found to flow between the two cut-outs and the terminal area.

Although this latter method is a simple way of carrying out an effective check on contacts such as those which exist at a portable card which may be a signal transmitter or receiver, the means which it employs are more suited to performing a check before the card is connected to a data-processing system. These means would in fact have the disadvantage of being too bulky to be left permanently attached to the card, particularly in cases where the card is a credit card of standard dimensions. Furthermore, in this particular case, it is necessary to check the quality of contact at the card when the contact is providing an electrical link to the card with the latter operating as a receiver. When the card is transmitting signals to the data-processing system through a contact made at the card, the quality of contact can be checked at the system by known means which are easily put into operation and which may consist for example in checking the received data by software means.

One of the objects of the invention is to provide permanent checking means which operate for the whole time during which signals are being transmitted from a transmitter to a receiver.

Another object of the invention is to provide means which do away with the need to perform a check at the input to a receiver.

BRIEF DESCRIPTION OF THE INVENTION

In accordance with the invention, an arrangement for checking contact between a transmitter circuit situated upstream and a receiver circuit situated downstream, the contact being made to enable electrical signals corresponding to 1 and 0 logic states produced by the transmitter circuit to be transmitted in series to an input of the receiver circuit, is characterised in that it is formed by a first circuit situated upstream of the contact at the output of the transmitter circuit and a second circuit which is situated downstream of the contact at the input to the receiver circuit, the first circuit being designed to produce, at a first output connected to the second circuit, and if the contact is satisfactory, a current in a predetermineed direction or the opposite direction in the presence of a signal representing a 1 or 0 logic state emitted by the transmitter circuit, the second circuit being designed to generate, at an output connected to the input of the receiver circuit, a signal corresponding to the logic state generated by the transmitter circuit when a current in the corresponding direction is emitted by the first circuit, the first circuit emitting a signal at a second output when the said current is present, this signal thus indicating that the contact is satisfactory.

BRIEF DESCRIPTION OF THE DRAWINGS

Other features and advantages of the invention will become apparent from the following description, which is given by way of non-limiting example with reference to the accompanying Figures.

DESCRIPTION OF THE PREFERRED EMBODIMENTS

Figure 1:
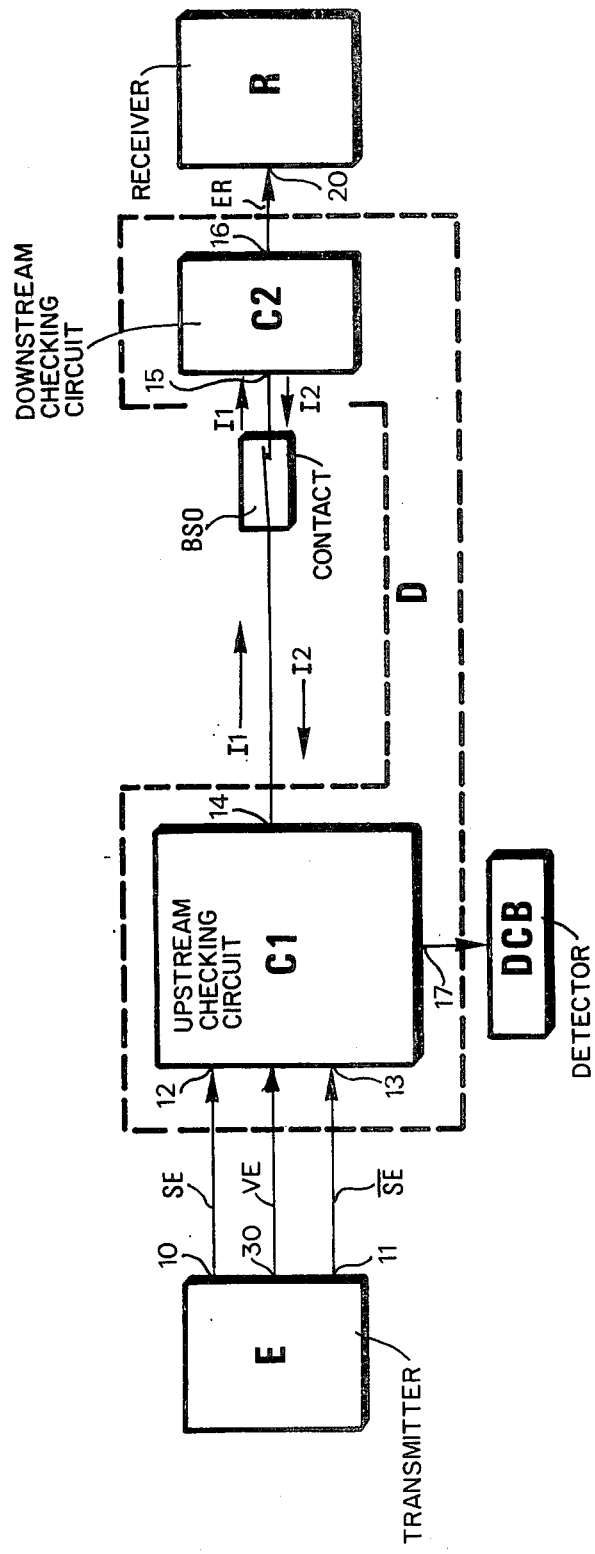
FIG. 1 is a general diagram of a contact checking arrangement according to the invention.

In FIG. 1, a contact BSO is inserted between a transmitter circuit E and a receiver circuit R. The transmitter circuit E is designed to transmit in succession, electrical signals which may be in one of two logic states 1 and 0. In FIG. 1, circuit E generates these signals, which are referred to as SE and $\overline{SE}$ respectively, from two outputs 10 and 11 which emit signals corresponding to the logic 1 state. When contact BSO is satisfactory, it operates as a closed switch for the downstream transmission of a signal emitted upstream. If contact BSO is unsatisfactory, it operates as an open switch and no signal is transmitted in either direction.

The arrangement for checking the contact BSO according to the invention is formed, in FIG. 1, by a first circuit C1 upstream of the contact and a second circuit C2 downstream of the contact. Circuit C1 has two inputs 12 and 13 which are connected to outputs 10 and 11 respectively of transmitter circuit E, and an output 14 which, when circuit BSO is satisfactory, is connected to an input 15 of circuit C2. Circuit C2 is connected by an output 16 to input 20 of the receiver circuit R. Circuit C1 is designed to generate from its output 14 a current I1 in a first predetermined direction (from left to right of FIG. 1) when it receives a signal SE at its input 12, but only if contact BSO is satisfactory. Circuit C1 generates from its output 14 a current I2 in a second predetermined direction (right to left in FIG. 1) when it receives a signal $\overline{SE}$ at its input 13, but only if contact BSO is satisfactory. Circuit C1 is also designed to generate a signal at its output 17 when one of the currents I1 and I2 is present at its output 14. Circuit C2 is designed to generate from its output 16 a signal ER which is equal either to the logic 1 state (generated by the transmitter circuit) when current I1 is present at its input 15, or to the logic 0 state (generated by the transmitter circuit) when current I2 is present at its input 15. Thus, by detection means DCB which received the signal emitted from the output 17 of C1, but are not included in the checking arrangement D, it is possible to verify whether contact BSO is satisfactory.

Figure 2:
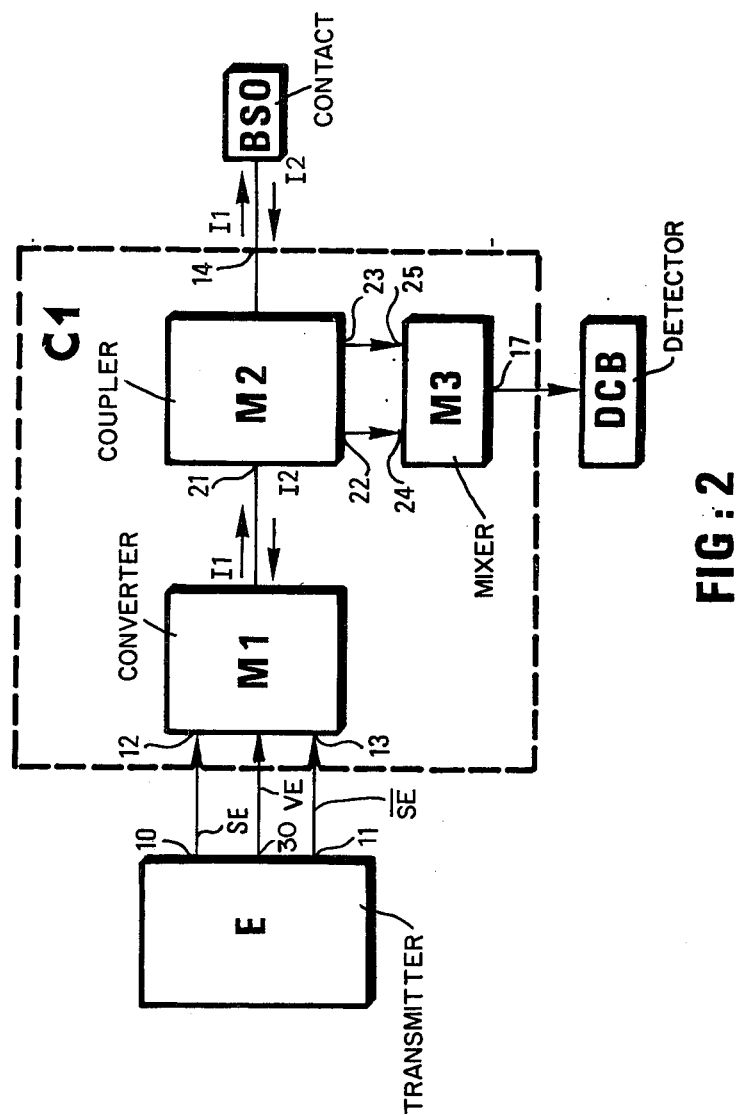
FIG. 2 is a general diagram of the first circuit contained in the arrangement according to the invention shown in FIG. 1.

In FIG. 2, the circuit C1 from FIG. 1 comprises first converting means M1 which are designed to convert the one of the two signals SE and $\overline{SE}$ which is received at one of the inputs 12 and 13 of circuit C1 into a current I1 or I2 of the form defined in the preceding part of the description, provided that contact BSO is satisfactory. Second, selective coupling means M2, which connect means M1 to output 14 of circuit C1 via an input 21, are designed to generate two outputs 22 and 23 which comprise signals in a predetermined logic state when current I1 or I2 is passing through the means M2 (which depends on the signal SE or $\overline{SE}$ emitted by circuit E). Third, mixing means M3 are connected by two inputs 24 and 25 to outputs 22 and 23 respectively. Means M3 are designed to produce a signal (at output 17 of circuit C1) when one of the two signals which are respectively emitted from outputs 22 and 23 of means M2 is present. Thus, when one of the two currents I1 and I2 is passing through means M2, a signal is fed to detector DCB of FIGS. 1 and 2 to allow a check to be made that the contact BSO of FIG. 1 is satisfactory.

Figure 3:
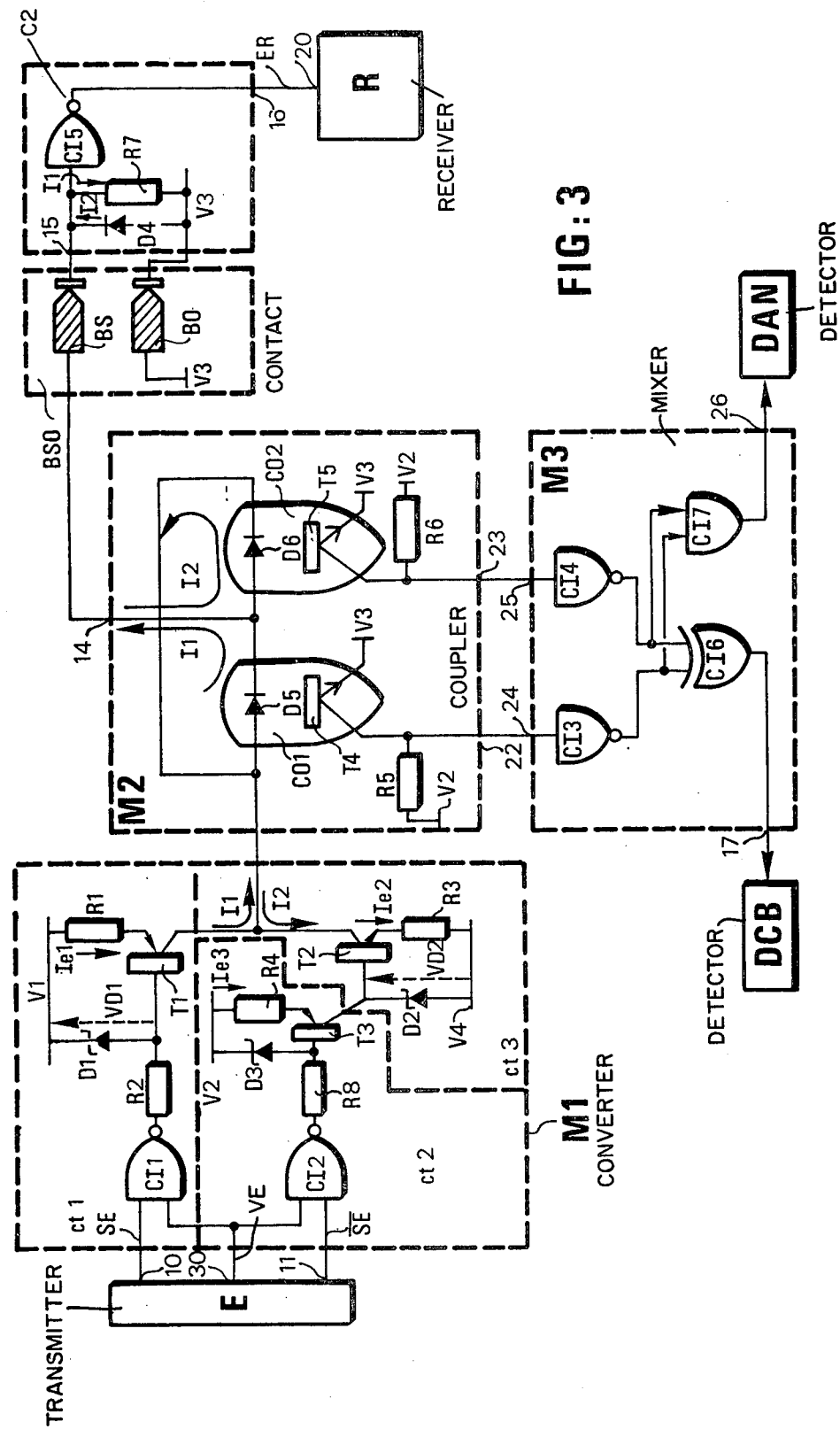
FIG. 3 shows embodiments of the first circuit of FIGS. 1 and 2 and of the second circuit of FIG. 1.

In FIG. 3, the means M1 from FIG. 2 contain two identical input circuits ct1, ct2 which are respectively made up of open-collector NAND gates (CI1 and CI2), resistors R2 and R8, transistors T1 and T3, diodes D1 and D3, and resistors R1 and R4. Two inputs of circuits CI1 and CI2 are connected to outputs 10 and 11 respectively of FIGS. 1 and 2 via inputs 12 and 13 of means M1. Other inputs of circuits CI1 and CI2 are connected to a third output 30 of the transmitter circuit of FIGS. 1 and 2. The resistors R2 and R8 are respectively connected between the outputs of circuit CI1 and CI2 and the bases of transistors T1 and T3. Diode D1 is connected between a voltage terminal V1 and the base of transistor T1. Diode D3 is connected between a voltage terminal V2 and the base of transistor T3. Resistor R1 is connected between voltage terminal V1 and the emitter of transistor T1 while resistor R4 is connected between voltage terminal V2 and the emitter of transistor T3.

The converter means M1 include a third output circuit ct3 formed by a transistor T2, a diode D2 and a resistor R3, the two latter being connected between a voltage terminal V4 and the base and emitter respectively of transistor T2. The output of means M1 is connected to the input 21 of the means M2 of FIG. 2 via a common connection between the collectors of transistors T1 and T2.

In FIG. 3, the means M2 consist of two identical circuits respectively formed by opto-electronic couplers CO1 and CO2 and resistors R5 and R6. The couplers CO1 and CO2 respectively contain light-emitting diodes D5 and D6 and photo-sensitive transistors T4 and T5 whose emitters are connected to a voltage terminal V3. Diodes D5 and D6 are connected together in series by a loop which is closed at input 21, this loop also being connected to output 14 by a connection between diodes D5 and D6. Resistors R5 and R6 are connected between voltage terminal V2 and the collectors of transistors T4 and T5, respectively.

In FIG. 3, the mixing means M3 contain two inverting circuits CI3 and CI4 whose inputs are connected to the transistors T4 and T5, respectively, and whose outputs are connected to two inputs of an exclusive OR circuit CI6 contained in means M3. By output 17 of means M3 of FIGS. 2 and 3, an output of circuit CI6 is connected to the detector DCB of FIGS. 1, 2 and 3.

In FIG. 3, the contact BSO of FIGS. 1 and 2 is represented by two pins BS and BO which are connected, respectively, to output 14 of means M2 of FIGS. 2 and 3, and a voltage terminal V3. A diode D4 and a resistor R7 in downstream checking circuit C2 are connected in parallel between input 15 of this circuit and pin BO and a voltage terminal V3, respectively. An inverting circuit CI5 in circuit C2 has one input connected to input 15 while its output is connected to input 20 of receiver circuit R via output 16 of circuit C2. The voltages V1, V2, V3, V4 at the various terminals in FIG. 3 (which are arranged in descending order from positive values to negative values) are supplied for example by four outputs of a common power supply not shown in FIG. 3.

When a signal SE emitted from output 10 of transmitter circuit E (representing the logic 1 state) is fed to one of the inputs of circuit CI1, a signal is generated from the open-collector output of this circuit when a validating signal VE emitted from output 30 of transmitter circuit E is present. The signal, which passes through resistor R2, enables transistor T1 to be unblocked and the emitter current Ie1 of the transistor is then equal in absolute value to the current I1 generated at the collector of transistor T1, which is fed to input 21 of means M2.

In terms of absolute value and as a function of the Zener voltage VD1 at the terminals of diode D1 and of the value of resistance R1, the current so produced is expressed by the equation $Ie1 = VD1/R1 = I1$. Since transistors T2 and T3 are blocked, the current I1 passes through the means M2 via diode D5 of coupler CO1 and then, via output 14, it travels through contact pin BS, resistor R7 and contact pin BO. The difference in potential across the terminals of R7 (which is equal in absolute value to the product of $R7 \times I1$) produces a first logic state at the input to inverter CI5 and the latter emits from output 16 a signal ER corresponding to the logic 1 state produced by the transmitter circuit. The passage of current I1 through diode D5 saturates transistor T4. The difference in potential which then exists across the terminals of resistor R5 produces a first logic state at the input to inverter CI3. At the output of circuit CI3 there is produced a signal which is fed to a first input of circuit CI6, from which the resultant signal is fed via output 17 to detector DCB, thus indicating that contact is satisfactory.

When a signal $\overline{SE}$ is emitted from output 11 of transmitter circuit E (corresponding to the logic 0 state) and is fed to one of the inputs of circuit CI2, a signal is generated from the open-collector output of this circuit if a validating signal VE emitted from output 30 of transmitter circuit E is present. The signal $\overline{SE}$, which passes through resistor R8, enables transistor T3 to be unblocked and the emitter current Ie3 of the transistor is then equal in absolute value to the current generated at the collector of transistor T3. This current flows through diode D2 and unblocks transistor T2. An emitter current Ie2 which flows through resistor R3 is equal in absolute value to a current I2 generated at the collector of transistor T2, which is connected to input 21. In terms of absolute value and as a function of the Zener voltage VD2 at the terminals of diode D2 and of the resistance of resistor R3, the current I2 so produced is expressed by the equation $Ie2 = VD2/R3 = I2$. Transistor T1, in the meantime, is blocked. The current I2 so produced flows through contact pin BO, diode D4, contact pin BS and the diode D6 in coupler CO2 and through the shunt loop to the collector of T2.

The difference in potential across the terminals of diode D4 generates a second logic state at the input to inverter CI5 and the inverter feeds to output 16 a signal ER corresponding to the logic 0 state generated by transmitter circuit E. The passage of current I2 through diode D6 in coupler CO2 saturates transistor T5. The difference in potential which then exists across the terminals of resistor R6 generates a first logic state at the input to inverter CI4. At the output of circuit CI4 is generated a signal which is fed to a second input of circuit CI6, the resulting signal from which is fed via output 17 to detector DCB, and indicates that contact is satisfactory.

If there is no anomaly in the circuits of the arrangement D of FIG. 1, but on the other hand the contact formed by the two pins BS and BO is unsatisfactory, current I1 cannot flow in resistor R7, nor can current I2 flow in diode D4, no matter whether circuit E transmits signal SE or signal $\overline{SE}$. In neither case does any current flow in diodes D5 and D6 and, since transistors T4 and T5 are not saturated, the inputs of circuits CI3 and CI4 are in a second logic state. Because of this, no signals are fed to the two inputs of the exclusive OR circuit CI6 and this circuit therefore emits no signal from output 17. However, an AND gate CI7 contained in means M3, whose two inputs are connected to the outputs of circuit CI3 and CI4 respectively, fails to generate a signal at an output 26 of means M3 in cases where the contact is unsatisfactory. If on the other hand the contact is satisfactory, but an anomaly exits in the circuits of means M2, the signals present at the outputs of circuits CI3 and CI4 are fed to the inputs of AND gate CI7 and the latter generates a signal at output 26. By connecting an anomaly detector DAN to output 26 it is possible to establish the cause of an error detected by detector DCB, i.e. unsatisfactory contact at BSO or an anomaly in the checking arrangement D. The detectors DCB and DAN may consist for example of simple indicator lights. The checking arrangement D which is the subject of the present invention thus enables a transmission error, which may occur in the course of operation of transmitter and receiver circuits when they are exchanging information, to be detected at any time.

The invention is particularly advantageous in cases where the transmitter circuit is a data-processing system and the receiver circuit is a credit card. In such cases it is particularly useful to transfer the check on the quality of contact (at the credit card) to the actual output of the data-processing system, thus avoiding loading the card with additional bulky circuits. Such a checking arrangement ensures that operation is properly synchronised between the card and the system to which it is connected. Any failure in the transmission of clock pulses between the system and the card is automatically indicated by the means described. Similarly, any erroneous data received by the card, which might be due to poor contact at the card, is automatically detected by the checking arrangement which is the subject of the invention.

I claim:

1. An arrangement for checking the quality of contact between a transmitter circuit situated upstream and a receiver circuit situated downstream, the contact being made to enable electrical signals corresponding to logic 1 and 0 states produced by the transmitter circuit to be transmitted in series to an input of the receiver circuit, comprising first circuit means situated upstream of the contact and connected to receive the output of the transmitter circuit, second circuit means situated downstream of the contact and connected to the input of the receiver circuit, the first circuit means being adapted to produce, at a first output, a continuous current in a predetermined direction or the opposite direction in the presence of a transmitter signal at the transmitter output representing a logic 1 or 0 state, the second circuit being adapted to generate, at an output connected to the input of the receiver circuit, a signal corresponding to the logic state generated by the transmitter circuit when said continuous current in the corresponding direction is emitted by the first circuit, the first circuit being adapted to emit a signal at a second output when the said continuous current is present for indicating that the contact is satisfactory.

2. A checking arrangement according to claim 1, wherein the first circuit comprises: converting means having first and second inputs connected to first and second outputs, respectively, of the transmitter circuit which emits signals corresponding to the logic 1 and 0 states to be transmitted to the receiver circuit and an output; selective coupling means for coupling said output of the converting means to the second circuit via the contact, when the contact is satisfactory; mixing means having two inputs connected to respective ones of two outputs of the selective coupling means, the converting means being adapted to generate, at the output connected to the selective coupling means, a current in a predetermined direction or the opposite direction when a signal is present at one of its two inputs, the selective coupling means being adapted to generate from the said two outputs second signals in predetermined logic states when the said currents of opposite direction are respectively present, the mixing means being adapted to generate a signal at its output indicative of a satisfactory contact when a signal is present at one of the two inputs of the mixing means.

3. A checking arrangement according to claim 2, wherein the second circuit means having its output connected to the receiver circuit includes second converter means having one input connected to the output of the first converter means via the selective coupling means and via the contact, when the latter is satisfactory.

4. A checking arrangement according to claim 3, wherein the converting means includes first and second converter circuits for connecting respective inputs of the converting means to the outputs of the transmitter circuit, each of the first and second converter circuits consisting of a transistor connected in a blocked condition and means to unblock said transistor when a signal is present at the input to the first circuit and thus to produce a current of predetermined direction or the opposite direction at the output of the first means.

5. A checking arrangement according to claim 4, wherein the selective coupling means contain first and second opto-electronic couplers each consisting of a diode and a transistor, the transistor of each coupler adapted to be saturated by the current which is generated in a predetermined direction from the output of the converting means when it flows through the diode of this coupler, with the result that a signal is generated at a corresponding output of the selective coupling means.

* * * * *